(12) United States Patent
Pan

(10) Patent No.: US 9,023,729 B2
(45) Date of Patent: May 5, 2015

(54) EPITAXY LEVEL PACKAGING

(71) Applicant: Eric Ting-Shan Pan, Fremont, CA (US)

(72) Inventor: Eric Ting-Shan Pan, Fremont, CA (US)

(73) Assignee: Athenaeum, LLC, Zephyr Cove, NV (US)

( * ) Notice: Subject to any disclaimer, the term of this patent is extended or adjusted under 35 U.S.C. 154(b) by 376 days.

(21) Appl. No.: 13/724,155

(22) Filed: Dec. 21, 2012

(65) Prior Publication Data
US 2013/0200429 A1 Aug. 8, 2013

Related U.S. Application Data

(60) Provisional application No. 61/580,086, filed on Dec. 23, 2011.

(51) Int. Cl.
| | |
|---|---|
| *H01L 23/48* | (2006.01) |
| *H01L 29/40* | (2006.01) |
| *H01L 21/78* | (2006.01) |
| *H01L 21/768* | (2006.01) |
| *H01L 23/498* | (2006.01) |
| *C30B 19/12* | (2006.01) |
| *C30B 23/02* | (2006.01) |
| *C30B 25/18* | (2006.01) |
| *H01L 21/20* | (2006.01) |
| *H01L 23/00* | (2006.01) |

(52) U.S. Cl.
CPC .......... *H01L 21/78* (2013.01); *H01L 21/76805* (2013.01); *H01L 23/49827* (2013.01); *C30B 19/12* (2013.01); *C30B 23/02* (2013.01); *C30B 25/18* (2013.01); *H01L 23/49833* (2013.01); *H01L 24/32* (2013.01); *H01L 24/83* (2013.01); *H01L 2224/29187* (2013.01); *H01L 2224/2919* (2013.01); *H01L 2224/32225* (2013.01); *H01L 2224/8385* (2013.01); *H01L 2224/83896* (2013.01); *H01L 2924/1461* (2013.01); *H01L 21/2007* (2013.01)

(58) Field of Classification Search
CPC ........... H01L 2924/00014; H01L 2224/29187; H01L 2224/2919; H01L 2224/8385; H01L 2224/83896; H01L 2924/1461; H01L 2924/00; H01L 2924/053
USPC .......... 438/125, 113, 637, 667, 107; 257/183, 257/774, E21.603, E27.012, E21.272, 257/21.108
See application file for complete search history.

(56) References Cited

U.S. PATENT DOCUMENTS 3,703,420 A * 11/1972 Vora .............................. 438/339
5,676,752 A * 10/1997 Bozler et al. .................... 117/89
(Continued)

OTHER PUBLICATIONS

Jokerst, N.M. et al., "The Heterogeneous Integration of Optical Interconnections Into Integrated Microsystems," IEEE Journal of Selected Topics in Quantum Electronics, 9, No. 2, Mar./Apr. 2003, 11 pages.
(Continued)

*Primary Examiner* — Vongsavanh Sengdara
*Assistant Examiner* — Thai T Vuong

(57) ABSTRACT

A method of growth and transfer of epitaxial structures from semiconductor crystalline substrate(s) to an assembly substrate. Using this method, the assembly substrate encloses one or more semiconductor materials and defines a wafer size that is equal to or larger than the semiconductor crystalline substrate for further wafer processing. The process also provides a unique platform for heterogeneous integration of diverse material systems and device technologies onto one single substrate.

21 Claims, 6 Drawing Sheets

Heterogeneous Integration

(56) References Cited

U.S. PATENT DOCUMENTS

| | | | |
|---|---|---|---|
| 6,500,731 B1* | 12/2002 | Nakagawa et al. | 438/455 |
| 7,238,598 B2* | 7/2007 | Lagahe et al. | 438/514 |
| 7,905,197 B2 | 3/2011 | Pan | |
| 8,193,078 B2 | 6/2012 | Pan | |
| 2004/0121564 A1* | 6/2004 | Gogoi | 438/479 |
| 2004/0183090 A1* | 9/2004 | Kitaoka et al. | 257/103 |
| 2006/0073681 A1* | 4/2006 | Han | 438/479 |
| 2007/0278631 A1* | 12/2007 | Sharifi et al. | 257/676 |
| 2010/0101725 A1* | 4/2010 | Pan | 156/345.15 |
| 2010/0102419 A1* | 4/2010 | Pan | 257/653 |
| 2010/0105194 A1* | 4/2010 | Pan | 438/481 |
| 2010/0203676 A1* | 8/2010 | Theuss et al. | 438/109 |
| 2012/0149148 A1* | 6/2012 | Dallesasse et al. | 438/107 |

OTHER PUBLICATIONS

Moutanabbir, Oussama et al.; "Heterogeneous Integration of Compound Semiconductors," The Annual Review of Materials Research, vol. 40, 2010, pp. 469-500.

Schüßer, Florian et al.; "New Solder Bumping Technology and Adapted Assembly Processes for 100 μm Pitch Flip-Chip-Technology Using Capillary Flow or No Flow Underfill," Proc 25th SMTA International, San Diego, CA, 2009, 9 pages.

Rauhala, E. et al.; Exfoliation of GaAs Caused by MeV 1H and 4He Ion Implantation at (100), (110) Axial and Random Orientations. Rauhala, E. and Räisänen, J. 3, 1994, Nuclear Instruments and Methods in Physics Research Section B: Beam Interactions with Materials and Atoms, vol. 94, pp. 245-250.

Woo, H.J. et al.: "Blistering/exfoliation kinetics of GaAs by hydrogen and helium implantations," Surface & Coatings Technology, vol. 203 (2009), pp. 2370-2374.

Schmidt, Martin A.; "Wafer-to-Wafer Bonding for Microstructure Formation,"1998, Proceedings of the IEEE, vol. 86, pp. 1575-1585.

Wolf,, M.J. et al.;"Technologies for 3D Wafer Level Heterogeneous Integration," EDA Publishing/DTIP, Apr. 9-11, 2008, 4 pages.

Fukushima, T. et al.; "Self-Assembly Process for Chip-to-Wafer Three-Dimensional Integration," 2007 IEEE Electronic Components and Technology Conference, pp. 836-841.

* cited by examiner

EPITAXY LEVEL PACKAGING

RELATED APPLICATION DATA

The present application claims the benefit under 35 U.S.C. §119(e) of the priority date of Provisional Application Ser. No. 61/580,086 filed Dec. 23, 2011 which is hereby incorporated by reference.

FIELD OF THE INVENTION

The present invention relates to structures and methods of heterogeneous integration of diverse material systems and device technologies onto a single substrate in the fields of semiconductors and related heterogeneous integration among microelectronics, optoelectronics, electromechanics, thermoelectrics, photovoltaics, thermo-photovoltaics, electrochemical, photo-electrochemical, piezoelectrics, superconductors, etc.

BACKGROUND

The following documents are incorporated by reference herein:
1. The heterogeneous integration of optical interconnections into integrated microsystems. Jokerst, N. M., et al., 2003 IEEE Journal of Selected Topics in Quantum Electronics, Vol. 9, pp. 350-360.
2. Heterogeneous Integration of Compound Semiconductors. Moutanabbir, Oussama and Gosele, Ulrich. 2010, The Annual Review of Materials Research, Vol. 40, pp. 469-500.
3. New Solder Bumping Technology and Adapted Assembly Processes for 100 μm Pitch Flip-Chip-Technology Using Capillary Flow or No Flow Underfill. Florian Schüßler, Rainer Dohle, Thomas Oppert, Ghassem Azdasht, Georgi Georqiev, Jörg Franke. 2009. The SMTA International Conference Proceedings.
4. Exfoliation of GaAs Caused by MeV 1H and 4He Ion Implantation at (100), (110) Axial and Random Orientations. Rauhala, E. and Räisänen, J. 3, 1994, Nuclear Instruments and Methods in Physics Research Section B: Beam Interactions with Materials and Atoms, Vol. 94, pp. 245-250.
5. Blistering/exfoliation kinetics of GaAs by hydrogen and helium implantations. Woo, et al., 17-18, 2009, Surface & Coatings Technology, Vol. 203, pp. 2370-2374.
6. Wafer-to-Wafer Bonding for Microstructure Formation. Schmidt, Martin A. 8, 1998, PROCEEDINGS OF THE IEEE, Vol. 86, pp. 1575-1585.
7. Technologies for 3D Wafer Level Heterogeneous Integration. M. J. Wolf, P. Ramm, A. Klumpp, H. Reichl. s.l.: EDA Publishing/DTIP 2008, 2008.
8. Self-Assembly Process for Chip-to-Wafer Three-Dimensional Integration. T. Fukushima, Y. Yamada, H. Kikuchi, T. Tanaka, M. Koyanagi. 2007. IEEE Electronic Components and Technology Conference.
9. Pan, Eric TS. Method of integrating epitaxial film onto assembly substrate. U.S. Pat. No. 8,193,078.
10. Pan, Eric TS. Apparatus for making epitaxial film. U.S. Pat. No. 7,905,197.

Systems integration and packaging is evolving along with emerging needs of systems. Mainframe computers drove the development of Multichip Modules (MCMs) by interconnecting multiple chips in a small, horizontal form factor to achieve high signal speed. High-end networking, signal processing, and digital communication demands drive System-on-a-Chip (SoC) by integrating all or most of the system needs on large and complex single chips, representing a confluence of previous product classes through integration of technology and design elements from other system driver classes such as microprocessor, application specific IC (ASICS) and analog/mixed signal circuits. Cell phones and handsets are driving System in Package (SiP) solutions by 3D chip stacking of either bare chips or packaged chips requiring interconnections from chip-to-chip using lateral or vertical integration technologies.

With the continued demand for systems and sub-systems (e.g. electronic, optoelectronic, electromechanical, etc.) having more functionality, higher performance, smaller size, lower cost, and faster time-to-market, advancing heterogeneous technology integration of components from different materials and fabrication processes makes possible many advanced systems (see reference #1 above). To this end, various hybrid integration technologies including heteroepitaxy (see reference #2), flip-chip bonding (see reference #3), layer lift-off and direct bonding see references (2) (4) (5), wafer transfer and bonding—see references (6) (7), micro-robotic pick and place, three-dimensional (3D) stacking and self-assembly (see reference (8)) methods have been explored. But in order to realize heterogeneous integration, new capabilities are needed: process technology, architectures, design methods and tools, and manufacturing test solutions.

Moreover, growth and fabrication procedures optimized for a single device technology often must be compromised to accommodate dissimilar material systems. This forces the costly development of customized processes for every component and prevents the use of low-cost foundries for producing the integrated systems.

SUMMARY OF THE INVENTION

An object of the present invention, therefore, is to overcome the aforementioned limitations of the prior art. It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions.

A first aspect of the invention concerns a method of processing an epitaxial wafer. Pieces from a plurality of compound semiconductor crystalline wafers are arranged into an assembly pattern. The pieces have a surface area within an assembly substrate that is larger than that of a single one of said plurality of compound semiconductor crystalline wafers. A separate assembly substrate—with a plurality of through substrate vias extending from a top surface to a bottom surface—is mounted over the assembly pattern. An epitaxial layer can then be formed in the assembly substrate within the plurality of through substrate vias with an epitaxial process.

Another aspect of the invention concerns wafer "scaling" for compound crystalline wafers. A plurality of compound semiconductor crystalline wafers (and/or portions thereof) having a particular diameter, size or surface area are arranged into an assembly pattern. An assembly substrate—which is larger than the original compound crystalline wafer—is mounted over the assembly pattern, thus acting as a template for an epitaxial process, albeit on a larger, scaled version of the original wafer. The assembly substrate includes a plurality of through substrate vias extending from a top surface to a bottom surface so that an epitaxial layer can be formed in the separate assembly substrate within such plurality of through substrate vias with an epitaxial process.

A further aspect of the invention concerns epitaxial wafer processing as noted above and in which two different types of compound crystalline materials may be used as seed layers to create a heterogeneous wafer having two different types of epitaxial material.

Further aspects of the invention concern both wafers and integrated circuits having the features described above, including larger composite wafer areas for faster processing, and flexible heterogeneous integration of multiple types of compound materials.

Embodiments of the present invention can offer a unique platform having multiple epitaxial structures made of one or more compound semiconductor (CS) materials on a single substrate (e.g. a passivated through-substrate-via such as TSV) that are referred to as epitaxy-level packaging (ELP); see references (9) (10). Homoepitaxy islands inside TSV wafers offer a planar wafer surface of multiple epitaxial areas of any type of CS material for heterogeneous integration with Si. This form of ELP technology reduces complex assembly and lattice engineering. Devices and ICs can be built from a single wafer Fab line and help resolve the perplexing issues of different CS wafer sizes and wafer fab processes.

The unique features of ELP afford 1) homoepitaxy of CS epitaxial islands that are grown from CS seed pieces, 2) process compatibility with most existing device and integrated circuit technologies, and 3) standardized wafer size regardless of variable sizes of different CS substrate materials. Embodiments of the invention implement heterogeneous integration with a transformational substrate platform that advances beyond conventional techniques, including: a) Heteroepitaxy in lattice-matched and metamorphic (lattice-mismatched) epitaxial engineering on a monolithic substrate where the complexity of epitaxial structure limits device reliability and increases cost, b) Wafer level packaging technologies, e.g. chip-scale packaging (CSP) with redistribution layers or flip chip mounted devices on wafer where the resulting package is about the same size as the die with no significant reduction in form factor, and c) 3D packaging also known as SiP or Chip Stack MCMs that stack separate chips in a single package much as if they were mounted in separate packages on a normal circuit board and which do not integrate the chips into a single circuit for signal performance enhancement.

DETAILED DESCRIPTION

Figure 1:
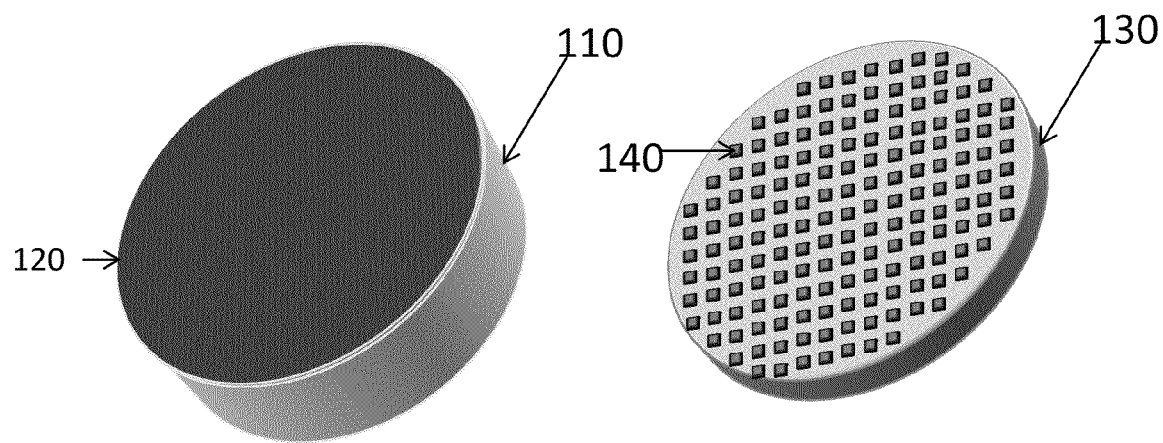
FIG. 1 illustrates some of the streamlined advantages of epitaxy-level packaging in material and process over standard material and conventional wafer fabrication process.

From the perspectives of material, processing, and assembly, ELP makes efficient use of compound semiconductor material by growing islands/pillars (and plateaus) of material rather than entire wafers, and further has the ability to integrate several different compound semiconductor materials (GaAs, GaN, InP, GaSb, InAs, GaP, InSb, AlN, SiC, SiGe, ZnS, ZnSe, CdTe, InGaP, InGaAs, AlGaAs, InGaN, AlGaN, etc.) on the same wafer platform (e.g. silicon) using existing wafer fabrication processes. Wafer level heterogeneous integration is readily achievable by selective masking and demasking of ELP structures (including islands) and Si regions/area either by fabricating each microsystem sequentially or fabricating multiple microsystems simultaneously by inserting/integrating modular steps of one microsystem into the flow of another microsystem at appropriate steps while preserving the electrical integrity of all microsystems. ELP can also use a uniform wafer size, and thus standardize wafer sizes to minimize fab line capital investment for conversion as materials substrate size changes. This technology provides a significant heterogeneous integration and manufacturing advantages. As seen in FIG. 1 this type of fully integrated device packaging is expected to reduce manufacturing and material cost compared to conventional wafer backend processing and packaging.

A conventional epitaxial package requires the following components/process:

Standard Material
A. Crystalline substrate 110
B. Epitaxial layers 120
C. Assembly/package substrate Conventional Epitaxial Process includes the following steps:
1. Epitaxial layer growth
2. Wafer processing (frontside)
3. Wafer mount
4. Wafer thinning (backside)
5. Wafer processing (backside)
6. Dicing
7. Die pick & place
8. Die attach
9. Interconnection
10. Encapsulation/Lid seal
11. Dejunk/Deflash or Singulation
12. Marking
13. Plating
14. Trim and Form In contrast, ELP Material in accordance with the present invention as seen in FIG. 1 generally includes:
ELP Substrate
Low-cost assembly substrate 130 replaces crystalline substrate
Conserved epitaxy area 140 (active region only)
ELP Streamlined Process
1. Epitaxial layer growth and transfer
2. Wafer processing (frontside)
3. Interconnection
4. Encapsulation
5. Singulation
6. Marking Further packaging innovations can be realized and implemented on this ELP-base device integration technology. Examples include integrated compound semiconductors on silicon, TSV 3D stacking, MEMS, SOC, SIP for even more consolidated wafer fabrication and streamlined assembly & test, and each of which improvements can lead to system cost reduction by achieving higher yield, lower cycle time, enhanced reliability and device miniaturization.

Figure 2:
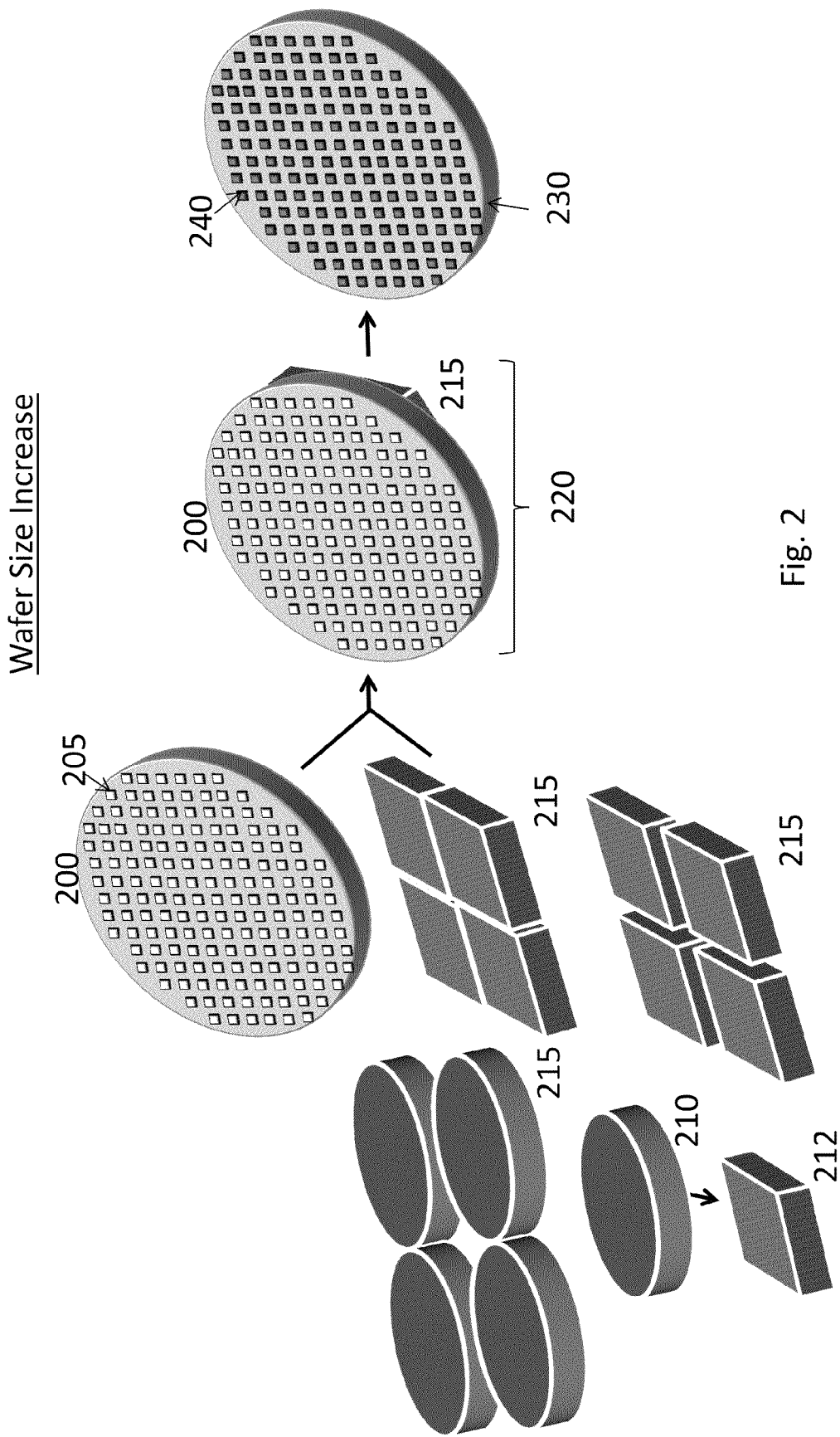
FIG. 2 describes an embodiment using an epitaxy-level packaging method for increasing wafer size of one or more target desired compound semiconductor material(s)
Figure 3:
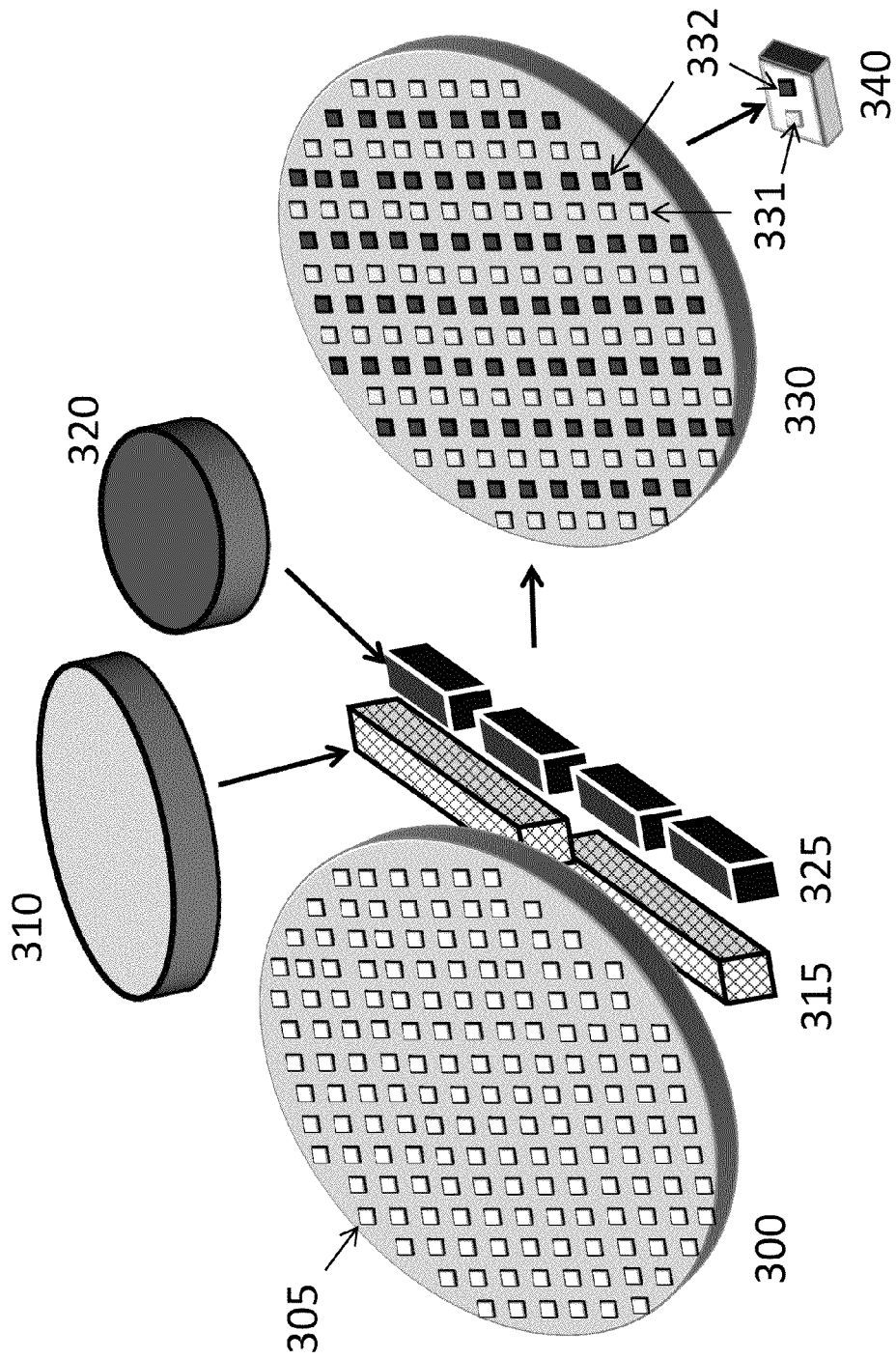
FIG. 3 describes another embodiment using an epitaxy-level packaging method for heterogeneous integration of two or more disparate semiconductor materials onto a single monolithic substrate.

FIGS. 2 and 3 depict embodiments of the invention offering unique solutions using an ELP wafer platform that cannot be replicated by other methods. A common scenario faced by integrated device manufacturers (IDMs) is to compete by pushing product's performance envelope at a steep cost curve. Because of their superior material properties, new compound semiconductor materials often provide such solution for performance breakthrough. However, the high cost of new compound semiconductor crystalline substrates prolongs or inhibits the commercialization process. Part of this cost is due to the reduced production capacity caused by smaller wafer sizes for compound materials. Capital investment to set up or retrofit a wafer fabrication line for smaller crystalline wafer size also adds cost and time.

The ELP wafer processing platform described herein can provide a standard wafer size for IDMs that is (equal to or) larger than a commercially available crystal size so as to permit IDMs to leverage their existing wafer fabrication resources without additional capital investment. FIG. 2 shows how an ELP method can be used to increase or standardize a wafer size of a compound semiconductor when a desired or target wafer size is not commercially available.

An assembly substrate 200 having a target size can be made of any material that has lower cost and a compatible coefficient of thermal expansion to that of a compound semiconductor crystalline substrate 210. In the present embodiments a silicon based ceramic is preferably used, although it will be understood by those skilled in the art that other materials known in the art or later developed and which are consistent with the present teachings can be employed to effectuate the benefits described herein. To realize ELP through substrate vias (TSV) 205 can be formed on assembly substrate 200.

To increase wafer size in the form of an ELP wafer, a smaller sized compound semiconductor crystalline substrate 210 is preferably cut into piece(s) of a square, rectangle or other convenient shapes 212. Multiple crystalline substrates or pieces 215 from different compound substrates 210 can be arranged in any pattern and placed under assembly substrate 200 (preferably without any atomic bonding) in a wafer holding apparatus (not shown, but which can be a tray or any convenient support apparatus) as a composite wafer 220 ready for epilayer growth by liquid phase epitaxy (LPE), hydride vapor phase epitaxy (HVPE), metal organic chemical vapor deposition (MOCVD), molecular beam epitaxy (MBE), or other epitaxial growth methods. These underlying compound semiconductor pieces 215 can function as a form of seed substrate during an epitaxial growth process. Accordingly epilayer(s) can form from the surface of crystalline substrate(s) 215 situated at a bottom portion of through substrate vias 205 and fill the vias into epitaxial islands/pillars 240.

Crystalline substrate(s) 215 may be removed by various methods such as ion cut, chemical etching, chemical-mechanical polishing, laser ablation, mechanical shearing, or any other suitable known technique at any stage during or after epitaxial island formation to form an ELP wafer 230 that has a desired pattern and a size equal to—or preferably larger—than a nominal compound semiconductor crystalline substrate 210. The throughput of the ELP platform therefore is a function of a largest assembly substrate 200 which can be accommodated by a epitaxial growth reactor or other piece of fabrication equipment, and is not constrained by the smaller available wafer size 210, which can be several times smaller than a silicon wafer (i.e., a few inches compared to 8 or 12 inches or future sizes larger-than-12 inches). This same principle can be exploited by equipment makers as well to permit larger reactors for epitaxial growth methods.

It will be understood that pieces 215 may in fact constitute different compound semiconductor materials. Moreover, it may be possible in some cases to use "blank" pieces 215' (not shown) during certain fabrication operations, which act as spacers/placeholders for later actual pieces 215 which may be necessary for subsequent operations. For example, certain materials 215 may not be compatible with each other, and it is desirable for them not to be subjected to the same process. The use of blank pieces could be exploited (i.e., they could be swapped in and out as needed during processing) to provide a more consistent process treatment across the entire composite substrate 220. In addition it may be useful (when lapping or thinning is difficult or expensive) to employ some form of spacer (not shown) in some instances where there is a large disparity in wafer thickness for the different materials. Conventional masking steps can also be used with composite substrate 220 to effectuate different types of patterns/circuits in different surface regions as is done with conventional ICs.

Another embodiment of heterogeneous integration through ELP is shown in FIG. 3. Compound semiconductor materials 310 and 320 are available only in different wafer sizes but are needed to make different types of devices for integration into a sub-module. The conventional way is to use two wafer fab lines to fabricate two separate integrated circuits (ICs), one for each material. At sub-module assembly, ICs made of materials 310 and 320 are typically on separate die attached onto a common substrate. Subsequent bonding and interconnection with other discrete components are done at chip-level packaging.

Using the present methods, however, a manufacturer can selectively grow materials 310 and 320 by cutting original crystalline wafers 310 and 320 into multiple pieces 315 and 325. These pieces can be arranged in a wafer holding apparatus (an assembly tray that can be matched to the assembly substrate) and placed under assembly substrate 300 (preferably without atomic bonding). From there epitaxial islands/pillars 331 and 332 can be grown sequentially (material of higher epitaxial growth temperature is grown before that of lower growth temperature) with appropriate masking and demasking of through substrate vias in order to grow from respective underlying crystalline pieces. Epitaxial islands/pillars 331 and 332 are thus formed into a single composite ELP wafer 330 using a single wafer fab line which can be equipped if desired to grow both types of materials. Devices and components can be constructed and connected at the wafer level for compaction and ease of assembly. Heterogeneous integration can thus be achieved much more efficiently as the ELP composite wafer 330 can be diced into chips 340. Each chip 340 can include at least two different circuits constructed of two different compound materials on a single die that is based on the composite wafer. This embodiment is not limited to two compound semiconductors but can be extended to a plurality of materials forming epitaxial islands.

Figure 4:
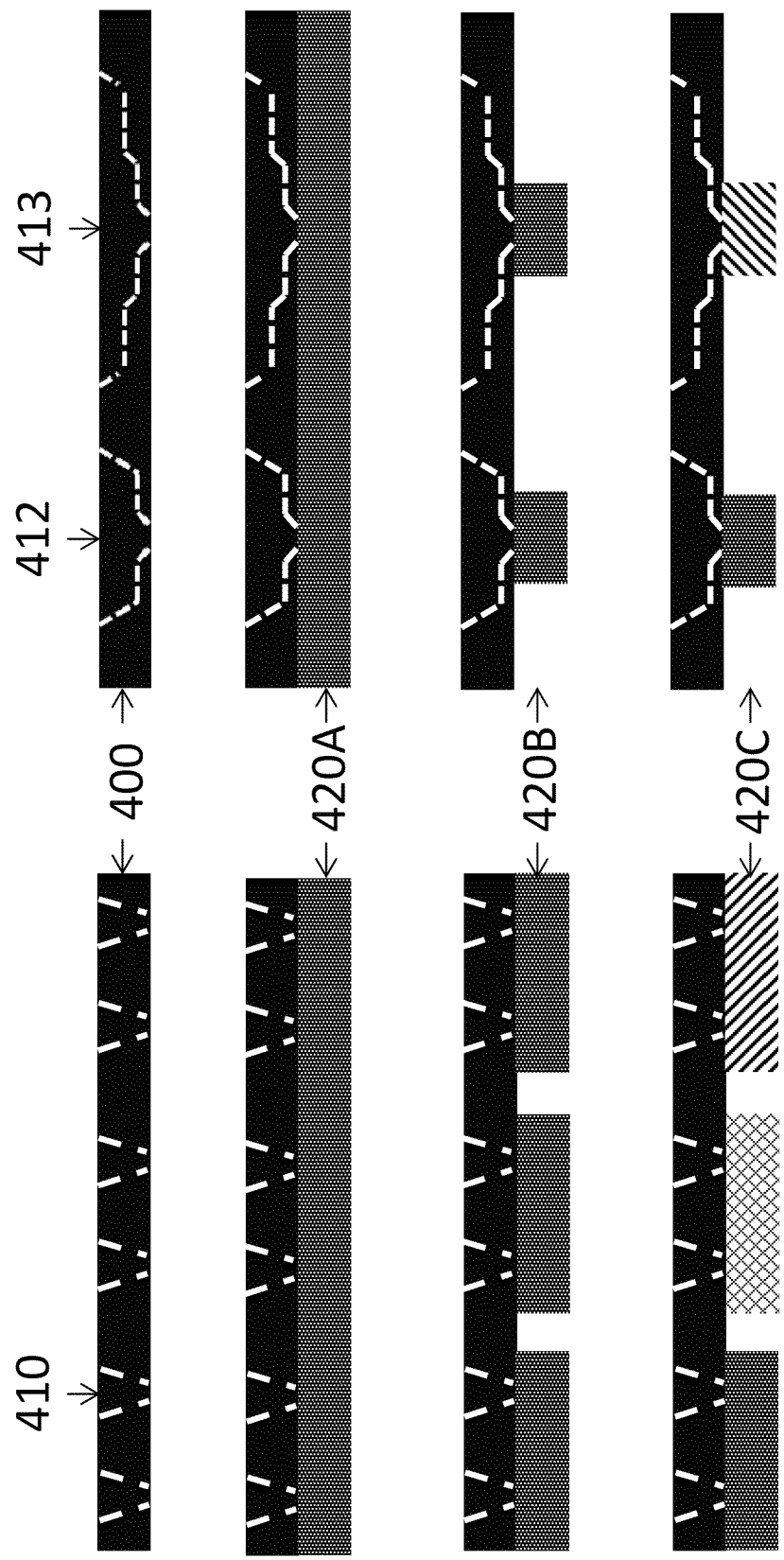
FIG. 4 illustrates various embodiments of assembly substrates and crystalline substrates suitable for the formation of ELP wafers.

FIG. 4 illustrates various embodiments of assembly substrates and crystalline substrates for the formation of ELP wafers. Through substrate vias formed in an assembly substrate 400 can be of multiple different forms and profiles, including: a) a single etch profile 410 with a 90-degree angle by isotropic etch; and/or b) having an inclined angle by anisotropic etch; c) double etch profile 412; c) triple etch profile 413, or a plurality of etches (not shown) to form a desired etch profile—epitaxial pattern. Other profiles and patterns will be apparent to skilled artisans.

Arrangements of crystalline substrates under the assembly substrate in a wafer holding apparatus can include: a) a single substrate 420A; b) multiple substrates or pieces of the same material 420B; and/or c) multiple substrates or pieces of different materials 420C. These arrangements depend on the target design of heterogeneous integration of devices and circuits made of different materials and can be varied as needed In case of heterogeneous integration of compound semiconductor devices with silicon, assembly substrate 400 can be made of silicon wafer etched to the desired etch profile. The silicon wafer with through substrate vias and desired etch profile can then be oxidized preferably to form a silicon oxide layer (not shown) as part of an ELP assembly substrate. After ELP epitaxial island growth, the silicon oxide layer (or other similar functioning layer) can be etched to open up silicon underneath for silicon device and circuit fabrication. Compound semiconductor devices and circuits can then be interconnected with silicon devices and circuits to form heterogeneous integrated circuits, modules, sub-systems, microsystems on a single wafer.

Figure 5:
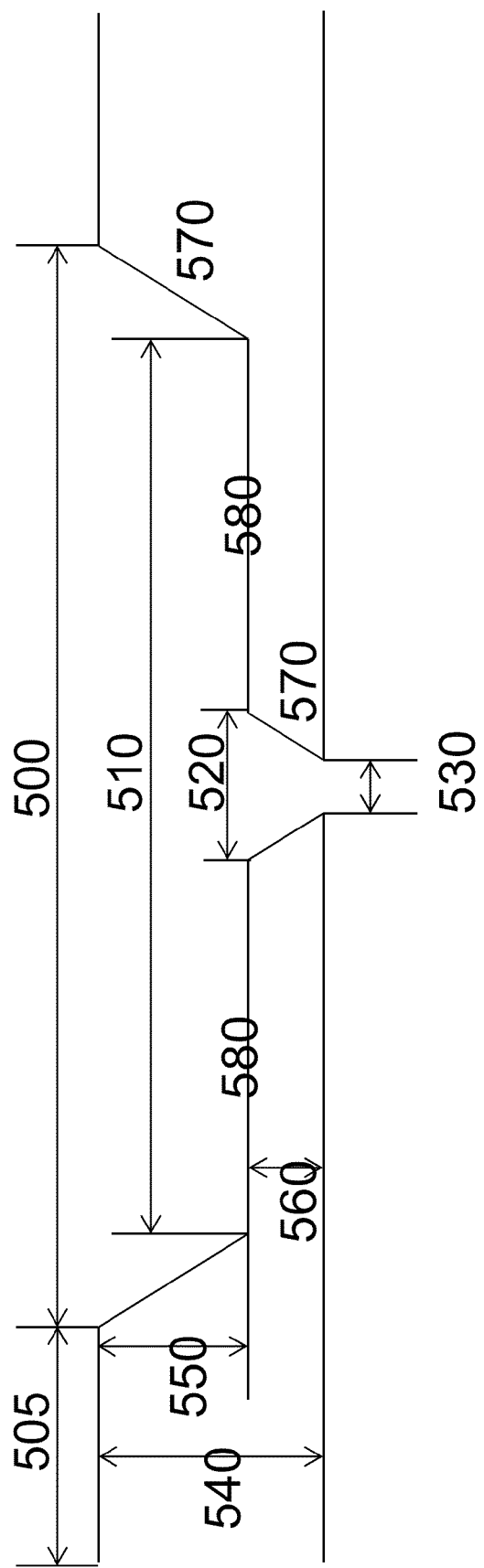
FIG. 5 is a detailed side view illustrating a preferred etch profile of an ELP assembly substrate

A preferred embodiment of an ELP assembly substrate 400 is shown in FIG. 5 which can be prepared with a bulk substrate having one continuous etch of through substrate vias or by two or more separate etch steps. While an etch is preferably used in the preferred embodiments to achieve a desired profile/three dimensional epitaxial pattern, it will be understood that other mechanisms for forming an assembly substrate 400 known in the art or later developed and which are consistent with the present teachings can be employed to effectuate the benefits described herein.

An etch profile/patterning of an ELP assembly substrate 400 is further detailed in FIG. 5 using an example of a double etch profile. Measurement 500 represents a width of a first photolithographic or mask opening for a first etch. Measurement 505 is a half-width between neighboring dice at the top surface of the substrate. Measurement 540 is a total thickness of the assembly substrate. Measurements 510 and 550 represent the width and the depth, respectively, of the first etch stop which can be a crystal plane 580 suitable for circuit fabrication and/or heterogeneous integration if assembly substrate 400 is made of silicon or another semiconductor material that may have a passivated coating such as silicon oxide. Width 510 can be determined by a target/desired integrated circuit feature size.

Similarly, measurements 520 and 560 represent a width of a second photolithographic or mask opening and depth, respectively, of a second etch that forms a through-substrate via. Width 520 defines a top of through-substrate via and is determined by transistor and/or circuit size based on the epitaxial materials to be grown inside the via. Thickness 560 defines a thickness of an epitaxial island. Measurement 530 is a width at the bottom of through-substrate via defining the opening for epitaxial layer growth to fill up the via.

Slope 570 may be an additional crystal plane formed by an anisotropic etch that is also used to impart a pattern to an epitaxial layer. After epitaxial layer(s) grow and fill up the through-substrate vias, standard planarization techniques (the process of increasing the flatness or planarity of a surface) may be applied to locally planarize the top surface of epitaxial islands together with the surface or subsurface of a crystal plane 580.

Again it will be apparent to those skilled in the art that other openings, geometries, etc. can be imparted to an assembly substrate in accordance with a desired/target epitaxial pattern. In addition it will be understood that other intermediary steps (additional etchings, depositions, etc.) could be employed in some instances without departing from the present teachings.

Figure 6:
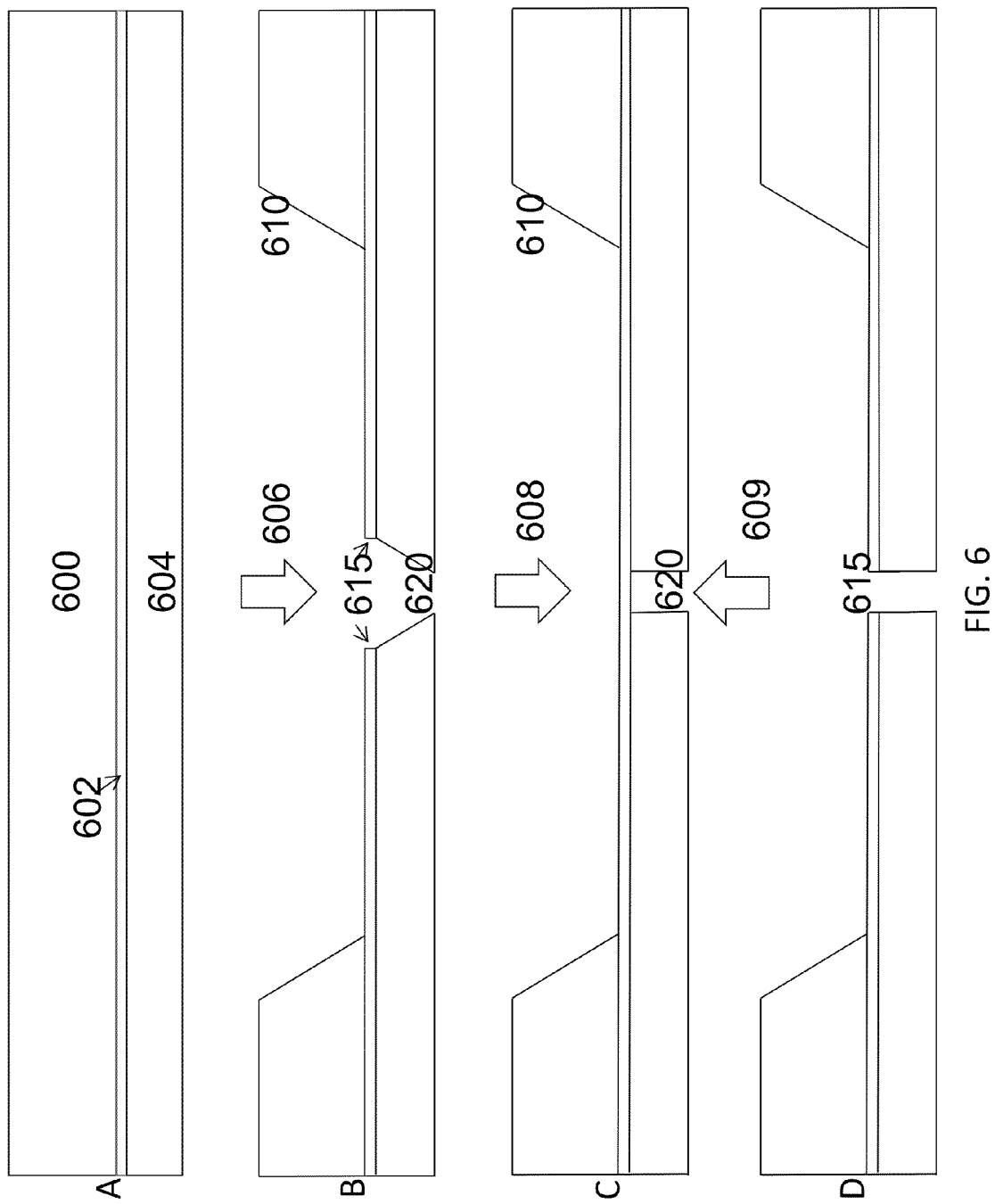
FIG. 6 illustrates further alternative embodiments for preparing an ELP assembly substrate.

FIG. 6 illustrates an embodiment in which multiple substrates are bonded and used as an ELP assembly substrate 400. An advantage of using different substrates is that they can include a composition or profile that is best adapted to a particular type of epitaxial material, so that different epitaxial materials can be grown in an optimal fashion. Another advantage is to reduce the thickness of through substrate vias and thus to minimize the thickness of epitaxial islands/pillars, which further reduces material consumption. Yet another advantage is to increase capability of heterogeneous integration of epitaxial islands with different assembly substrate materials in vertical direction. Inset A gives an example of bonding of two separate substrates 600 and 604 through an oxide or an interfacial adhesion layer 602. Other techniques known in the art or later developed and compatible with the present teachings may also be employed.

As above etching 606 can be performed in a single or multiple steps (Inset B) to etch a trench 610 through substrate 600 which ends at interfacial adhesion layer 602. Photolithography or an equivalent masking step can be performed to define an opening 615 on interfacial adhesion layer 602 for a second etch. A third etch can be performed through the opening 615 to form through substrate vias 620.

Inset C in FIG. 6 illustrates another way to form an assembly substrate 400 by etching from opposite sides of multiple bonded substrates. An etch 608 made through top substrate 600 along with an etch 609 through substrate 604 can be performed in any desired sequence. An etch profile of through substrate via 620 can be varied/customized or tailored to achieve a desired shape depending on the type of etching (e.g. wet etch or dry etch) and chosen substrate materials. To complete an assembly substrate from a final etch is used to provide an opening 615 through any interfacial adhesion layer (Inset D).

It will be apparent to those skilled in the art that the above is not intended to be an exhaustive description of every embodiment which can be rendered in accordance with the present teachings. Other embodiments could be constructed which use a combination of features from the above described exemplary forms. Accordingly the present disclosure will be understood by skilled artisans to describe and enable a number of such variants as well

What is claimed is:

1. A method of processing an epitaxial wafer comprising:
   arranging a plurality of compound semiconductor crystalline wafers and/or portions thereof into an assembly pattern;
   wherein said plurality of compound semiconductor crystalline wafers and/or portions thereof are derived from wafers having at least one first nominal size including a first diameter;
   mounting a separate assembly substrate over said assembly pattern, said separate assembly substrate having a second size, including a second diameter which exceeds said first diameter;
   wherein said separate assembly substrate includes a plurality of through substrate vias extending from a top surface to a bottom surface which contacts said assembly pattern;
   forming an epitaxial layer in said separate assembly substrate within said plurality of through substrate vias with an epitaxial process.

2. The method of claim 1 wherein said separate assembly substrate is a solid rigid disc.

3. The method of claim 1 wherein said epitaxial process comprises liquid phase epitaxy (LPE), hydride vapor phase epitaxy (HVPE), metal organic chemical vapor deposition (MOCVD), molecular beam epitaxy (MBE), or other epitaxial growth methods.

4. The method of claim 1 wherein said plurality of compound semiconductor crystalline wafers include at least two separate wafers comprised of two different materials.

5. The method of claim 1 wherein a reactor used for said epitaxial process forms an epitaxial layer on N separate compound semiconductor crystalline wafers at the same time.

6. The method of claim 5 wherein said reactor has a throughput rate that is approximately N times faster than that required by the reactor to form N separate epitaxial layers on N sequential compound semiconductor crystalline wafers processed at different times.

7. The method of claim 1 further including a step: etching said assembly substrate to form said through substrate vias to include one or at least two different profile shapes within said substrate.

8. The method of claim 1 further including a step: performing at least two separate etch operations on said assembly substrate to form two separate features of a profile of said through substrate vias.

9. The method of claim 1 wherein said assembly substrate includes two separate substrates bonded together.

10. The method of claim 9 wherein said two separate substrates include two different materials or one material of different thicknesses bonded by an interfacial adhesion layer.

11. The method of claim 1 further including a step: cutting said assembly substrate into pieces corresponding to an integrated circuit.

12. The method of claim 11 wherein an amount of epitaxial material required by a reactor to make said integrated circuit in said assembly substrate is less than that required to manufacture said integrated circuit directly on a crystalline substrate without said assembly substrate.

13. A method of processing an epitaxial wafer comprising:
arranging a plurality of pieces of a plurality of compound semiconductor crystalline wafers into an assembly pattern;
wherein said plurality of pieces have a surface area within an assembly substrate that is larger than that of a single one of said plurality of compound semiconductor crystalline wafers;
mounting a separate assembly substrate over said assembly pattern, said separate assembly substrate including a plurality of through substrate vias extending from a top surface to a bottom surface which contacts said assembly pattern;
forming an epitaxial layer in said separate assembly substrate within said plurality of through substrate vias with an epitaxial process.

14. The method of claim 13 wherein said mounting is done without atomic bonding between said separate assembly substrate and said assembly pattern.

15. A method of processing an epitaxial wafer comprising:
arranging a plurality of pieces of a plurality of compound semiconductor crystalline wafers into an assembly pattern;
wherein said plurality of pieces including materials from at least two different compound semiconductor types;
mounting a separate assembly substrate over said assembly pattern, said separate assembly substrate including a plurality of through substrate vias extending from a top surface to a bottom surface which contacts said assembly pattern;
forming at least two separate epitaxial structures in said separate assembly substrate within said plurality of through substrate vias with two separate epitaxial growth processes;
wherein said two separate epitaxial growth processes form layers on different ones of said at least two different compound semiconductor types of material.

16. The method of claim 15 wherein said plurality of pieces include adjacent pieces in said assembly substrate having said at least two different compound semiconductor types.

17. The method of claim 16 further including a step: connecting said adjacent pieces within an interconnect.

18. The method of claim 17 further including a step cutting said assembly substrate into discrete pieces corresponding to an integrated circuit, wherein said integrated circuit includes a heterogeneous circuit comprising at least two different materials types.

19. The method of claim 15 wherein a single reactor performs both of said two separate epitaxial growth processes.

20. The method of claim 15 said at least two different compound semiconductor types of material are processed within a common separate substrate.

21. The method of claim 15 wherein said mounting is done without atomic bonding between said separate assembly substrate and said assembly pattern.

\* \* \* \* \*